United States Patent

Liu

[11] Patent Number: 6,030,898
[45] Date of Patent: Feb. 29, 2000

[54] ADVANCED ETCHING METHOD FOR VLSI FABRICATION

[75] Inventor: Yowjuang W. Liu, San Jose, Calif.

[73] Assignee: Advanced Micro Devices, Inc., Sunnyvale

[21] Appl. No.: 08/994,707

[22] Filed: Dec. 19, 1997

[51] Int. Cl.[7] .................................................. H01L 21/00
[52] U.S. Cl. ...................... 438/692; 438/705; 438/787; 438/786; 438/791; 438/524; 438/549; 438/551; 204/192.37
[58] Field of Search .................................. 438/705, 692, 438/787, 786, 791, 524, 549, 551; 204/192.37

[56] References Cited

U.S. PATENT DOCUMENTS

| | | | |
|---|---|---|---|
| 3,767,492 | 10/1973 | MacRae et al. | 438/705 |
| 4,925,805 | 5/1990 | Van Ommen et al. | 438/705 |
| 5,350,484 | 9/1994 | Gardner et al. | 438/705 |
| 5,358,908 | 10/1994 | Reinberg et al. | 438/705 |
| 5,436,174 | 7/1995 | Baliga et al. | 438/705 |
| 5,449,630 | 9/1995 | Lur et al. | 438/705 |
| 5,641,380 | 6/1997 | Yamazaki et al. | 438/705 |
| 5,662,768 | 9/1997 | Rostoker | 438/705 |
| 5,872,045 | 2/1999 | Lou et al. | 438/705 |

*Primary Examiner*—Nam Nguyen
*Assistant Examiner*—Steven H. VerSteeg
*Attorney, Agent, or Firm*—LaRiviere, Grubman & Payne, LLP

[57] ABSTRACT

The present invention provides a method of etching microelectronic structures. The method utilizes an ion implantation device projecting ions into a silicon semiconductor or conducting substrate to selectively damage the surface causing damage differential. This process is highly controllable and directable, allowing fine manipulation of the substrate surface. After the ion implantation has destroyed selected portions of the surface, standard etching techniques known in the art can be used to selectively remove the damaged portions of the surface. The advantage of this technique is that it confers upon relatively imprecise prior art etching techniques a high degree of precision. Such techniques can be used to create isolation trenches by filling the surface with electrically isolating materials which isolate one semiconductor device from another.

18 Claims, 9 Drawing Sheets

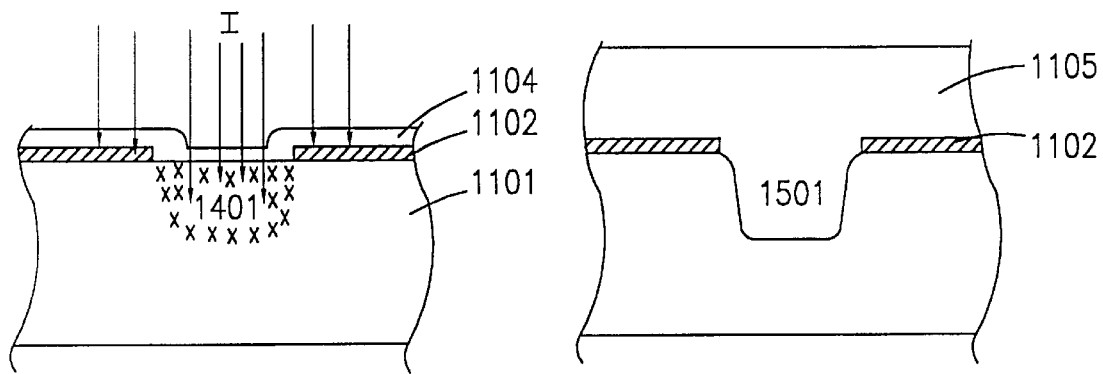
Figure 14
Figure 16
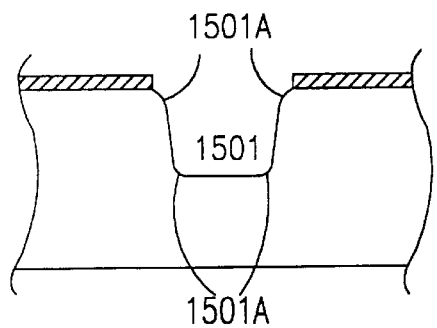
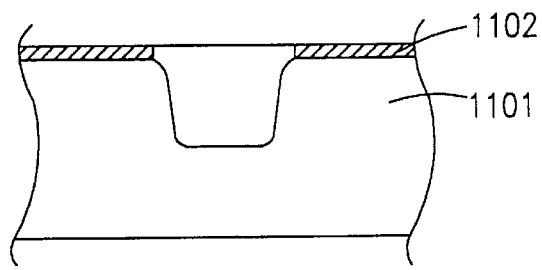
Figure 15
Figure 17

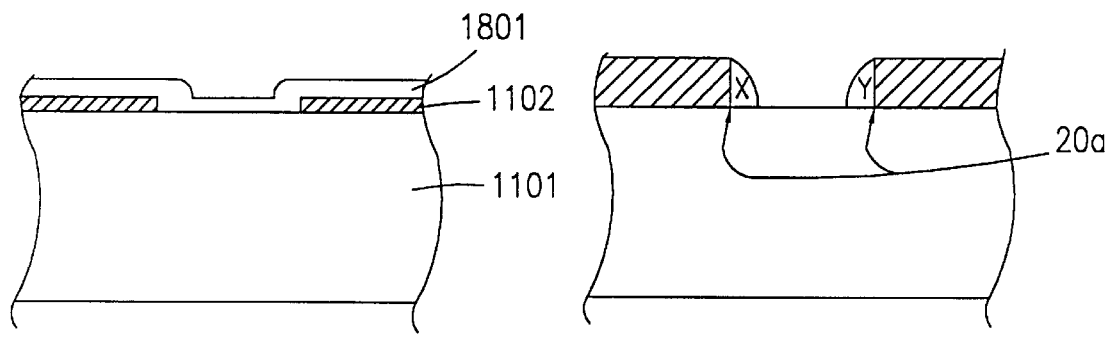
Figure 18
Figure 20
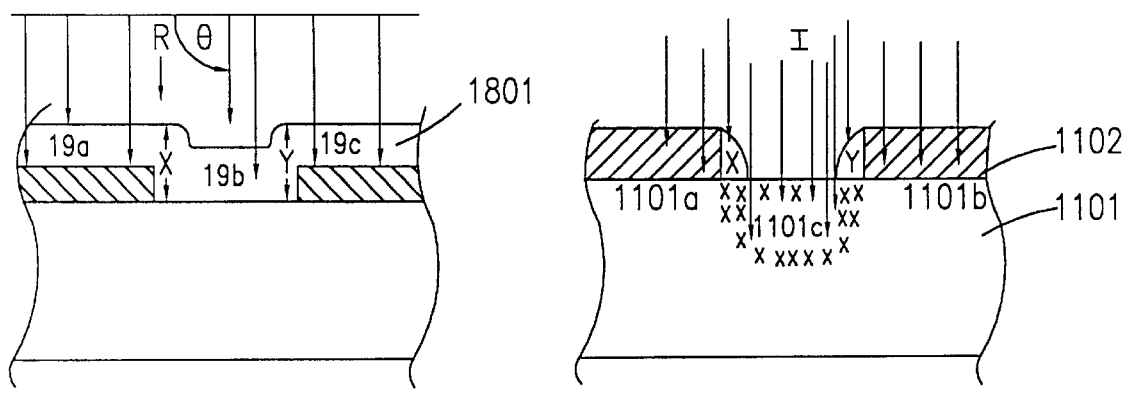
Figure 19
Figure 21

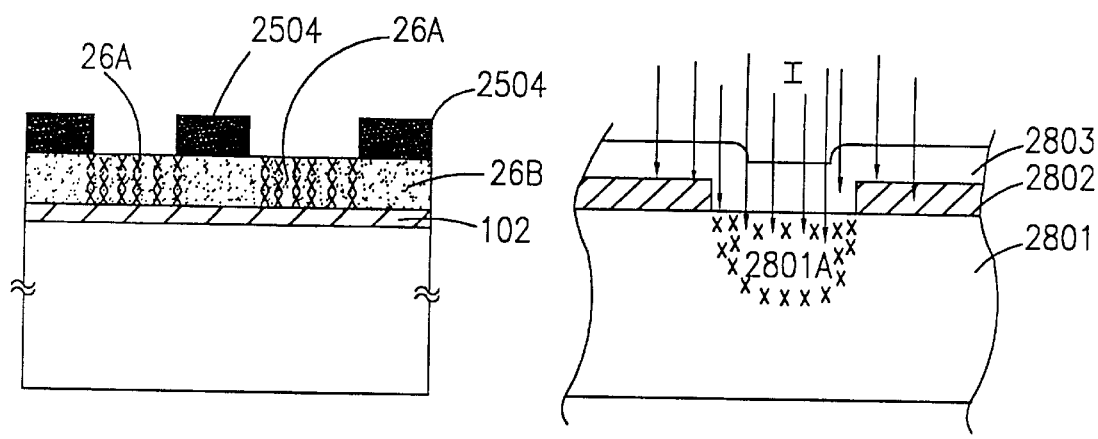
Figure 26
Figure 28
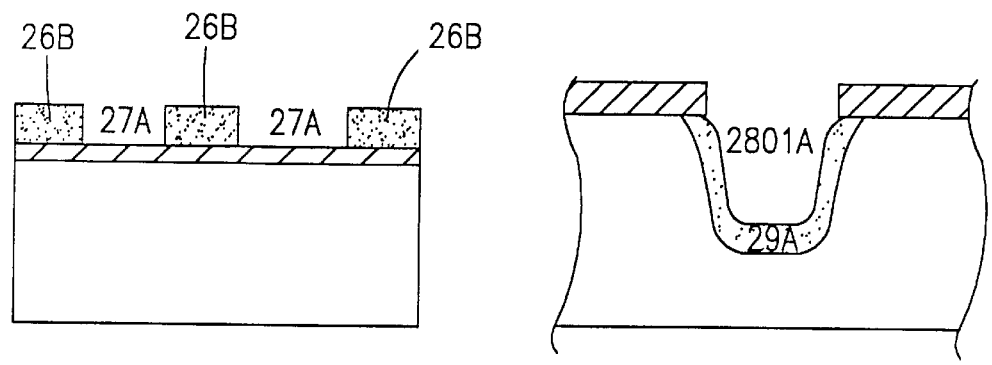
Figure 27
Figure 29

ADVANCED ETCHING METHOD FOR VLSI FABRICATION

TECHNICAL FIELD

The present invention relates to the etching processes used in the fabrication of integrated circuits. More particularly, the invention relates to an advanced method for fabricating isolation trenches used in microelectronic circuits.

BACKGROUND OF THE INVENTION

Microelectronic circuits, in the form of integrated circuits, are constructed in a multitude of process steps. Among the most critical steps is the etching process. Etching is the process by which circuit patterns are permanently transferred onto the surface layer of a semiconductor wafer. The etching process removes the top layer(s) of the wafer surface through openings in a surface pattern. The pattern of these openings are known as the mask. The primary goal of etching is to transfer an exact mask pattern into the wafer surface. Other objects of etching are pattern uniformity, edge profile control, selectivity, cleanliness, and low cost.

In general, etching falls into two main categories; wet and dry. Historically, etching has been accomplished by immersion in, or spraying on of wet etchants. (In general, etchants are acids which are applied to the surface of the wafer for a specified time, selectively dissolving the wafer surface in unmasked areas, allowing a specific pattern to be etched into the wafer surface.) Wet etch techniques are effective when the feature size of the microelectronic device is larger than 3 $\mu$m in size. However, in the ongoing pursuit of smaller feature sizes, dry etching was developed. Dry etch techniques include: plasma etching, ion beam etching, and reactive ion etching (RIE). All of these techniques, dry and wet, have significant limitations. Wet etchants suffer from isotropic effects, which result in unintentional non-uniform sloping of the side walls in the etched areas. The longer the etch time, the more magnified the effect. Dry etch techniques suffer from a variety of different limitations including radiation damage, photoresist hardening (making the resist hard to remove after the etching is finished), difficulty in maintaining etch profile, unpredictability of results over long etch times (especially in deep trenches with high aspect ratios), dilution effects which reduce the effectiveness of the process, and poor selectivity. All of these effects are well known in the art.

SUMMARY OF THE INVENTION

The invention is a new method of etching surfaces. The invention allows faster etching of surfaces, shorter etch times, better etch selectivity, more precise control of the etched surface profile, and precise shaping of the etched surfaces. Perhaps the greatest advantage of the invention is the ability to enhance the etching capabilities of existing techniques without the need for new process equipment. The invention also reduces fabrication costs through quicker etch times without the need for additional equipment.

The invention uses ion implanters to increase the effectiveness of existing etching processes. Ion implanters have been used in microcircuit fabrication for years as a doping device. One of the chief drawbacks of ion implantation is that it damages the silicon wafer's crystalline surface. The damage is particularly severe when heavier ions (e.g. phosphorous, arsenic, antimony, germanium, and silicon, etc.) or high doses of lighter ions (e.g. silicon, boron, oxygen, etc.) are used. The problem is so significant that a process known as annealing is used to restore the damaged crystalline wafer surface.

The applicant's invention turns this marked drawback into a significant advantage. By bombarding a masked wafer surface with heavier ions or high doses of lighter ions, the ion implantor is used to selectively damage exposed areas of the wafer's crystalline surface. The damaged areas are preferentially more vulnerable to standard etch techniques.

Standard wafer fabrication techniques are used to create the basic wafers. These basic wafers (which may be doped or not) are oxidized and masked by methods known by practitioners with ordinary skill in the art. Masking is used to achieve a specific wafer pattern. Patterning is the basic operation used to remove specific layers of the wafer's surface. The determination of which layers are removed is made by the process engineer, and through various steps known to practitioners with ordinary skill in the art, the wafer's surface is contoured, shaped and molded to form circuits (transistors, diodes, resistors, capacitors, etc.). The large-scale concentration of these minute circuits on small surfaces leads to very large-scale integrated circuit production. Significant limitations to the process of wafer patterning are inherent limitations in the etching processes. For example, wet etching techniques are generally not useful for feature sizes less than three micrometers, due to isotropic etching effects, chemical unpredictability, and etchant wettability problems. Dry etching techniques suffer from a variety of etching limitations as well. For example, when using plasma etching radiation damage (due to high energy levels needed to generate plasma fields) is a significant problem. Dry etching also suffers from poor selectivity (inherent to physical processes which damage all surfaces unlike chemical processes which can selectively damage certain surfaces more than others), and dilution effects which slow etch rates near the end of the process. The applicant's invention minimizes many of these problems by reducing process time and creating an etchant enhancing environment. The invention overcomes many of these problems by using existing ion implantation devices in a new way.

The invention uses an ion implanter to damage wafer surfaces. Heavier ions (e.g. arsenic, germanium, antimony, phosphorous, gallium, etc.), are ionized and isolated, accelerated, formed into a beam, and projected onto the wafer's surface. Similarly, lighter ions (e.g. boron, oxygen ($O_2$), silicon, etc.) at high dosage levels may be used to damage the wafer surface. The ion implanter selectively damages unprotected areas of the silicon wafer surface. The damaged portions of the surface are more vulnerable to etching techniques. An additional advantage of the applicant's invention is the wide variety of common semiconductor process elements which can be used to mask the effects of the ion implantation beam (e.g. photoresists, silicon dioxides, silicon nitrides ($Si_3N_4$), silicon oxynitrides (Si $O_xN_y$, where x and y are numbers describing the ratio of oxygen to nitrogen), aluminum, and other metals).

By using masks and the unique directional control capabilities of ion implanters, selected areas of the wafer's surface can be damaged. The damage can be precisely and accurately controlled by varying the impact angle, rate of wafer rotation, ion implantation current, temperature, exposure time, dosage, or energy level, etc. This allows the unmasked areas of the silicon surface to be preferentially damaged while leaving the masked crystal structure of directly adjacent neighboring areas undamaged. This causes a damage differential in the silicon wafer surface which has several beneficial effects. The damaged areas of the silicon crystal are far more vulnerable to removal by conventional etching technologies than the neighboring areas of undamaged silicon crystal. The significant advantage of this approach is that when the silicon wafer surface is subsequently etched, the effectiveness of any standard etch technique is enhanced when used on the damaged surfaces. The damaged surfaces are preferentially attacked by the etchant and much more vulnerable to the etchants than the undamaged areas of silicon crystal. The damaged areas are also etched more rapidly, reducing isotropic effects. Furthermore, because ion implantation is a physical process, deriving its effectiveness from the concept of momentum transfer which damages the surface by the physical impact of accelerated ions, it is extremely directional in nature. This creates a highly controllable and directional device which damages only the areas that the ion implanter is directed to. The end result of this new process is that very narrow and deep areas of damage can be created. These areas can also be shaped to create specific dimensions in the final product by altering the angle at which the ions impact the surface. This allows for the construction of narrow and deep areas of damage, shaped in very specific and desirable ways. This can be used to round trench corners reducing edge effects, thereby reducing the chances of circuit failure. The creation of very narrow damage zones aids in the scaling down of circuit device size and also maximizes usage of the wafer surface by not wasting valuable surface area, allowing greater circuit density on the wafer surfaces.

The net result of these advantages are that the damaged areas of silicon are easily removed in a shorter period of time by the etchants, while the undamaged silicon surface is relatively unaffected by the same etchants. This reduces isotropic etch effects. Further, the accurate and precise selective damage to specific areas of the substrate caused by the ion implanter allows very accurate, uniform and efficient etching. Furthermore, due to the computer control of the ion implanter the effect is easily and precisely reproducible. Standard etching techniques in contrast, have very poor etch definition, are subject to isotropic etching problems, and non-uniform etching profiles. The invention allows standard etch techniques to reap the benefits of the highly accurate and precise ion implantation technique without any significant increase in cost. The result is a technique which allows good etch definition, high aspect ratios, the ability to shape the etched surface precisely, and reduced etching times, all without any new equipment or increase in cost. Moreover, the etch parameters (angle of implantation, implant current, rate of wafer rotation, dosage, temperature, etc.) can be easily controlled by computer, increasing repeatability and thereby reliability. Furthermore, all of the above-mentioned techniques and advantages can be applied to any semiconductor surface as well as conducting surfaces. In short, the invention increases the effectiveness of all existing etch techniques.

BRIEF DESCRIPTION OF DRAWINGS

FIG. 14 shows the substrate of FIG. 13 during ion implantation.

FIG. 15 depicts the substrate of FIG. 14 after etch, creating an isolation trench.

FIG. 16 shows the substrate of FIG. 15 after deposition of an electrically isolating material.

FIG. 17 shows the substrate surface of FIG. 16 after chemical mechanical process has polished the surface down into the silicon substrate, leaving an isolation trench.

FIG. 18 shows the etched surface of FIG. 12 with a conformal oxide layer.

FIG. 19 shows the surface of FIG. 18 during reactive ion etching.

FIG. 20 shows the after effects of a reactive ion etch of the surface of FIG. 19, including the remaining oxide spacers.

FIG. 21 shows the use of the ion implanter to selectively damage the surface of FIG. 20.

FIG. 26 shows a damage differential created in the current conducting layer by the ion implanter.

FIG. 27 shows the surface of FIG. 26 after etching away the conducting layer into the oxide layer and photoresist removal.

FIG. 28 shows the surface of FIG. 13 during ion implantation.

FIG. 29 depicts the structure of FIG. 28 after etching removes the polysilicon layer and the damaged semiconductor substrate, leaving a highly doped region.

SPECIFIC EMBODIMENTS

The techniques disclosed above can be used to create narrow isolation trenches between the various integrated circuit components. These techniques can be used for a wide variety of substrates including semiconductors and conductors.

Figure 1:
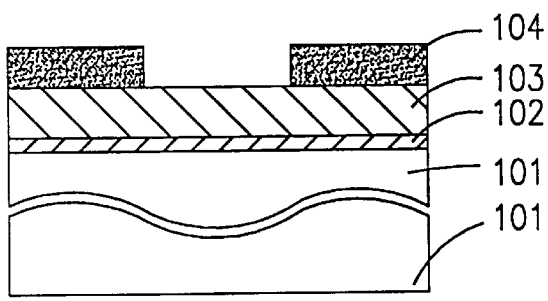
FIG. 1 shows an oxidized and nitridized semiconductor wafer surface with a photoresist mask in place.

In the embodiment of FIG. 1, the substrate (101) is silicon crystal. Although the substrate (101) of FIG. 1 is silicon, it can be constructed with any semiconducting material (e.g. silicon, gallium arsenide, etc.) and may be doped or undoped. The silicon substrate (101) is covered with an oxide layer (102) (e.g. $SiO_2$) and a nitride layer (103) (e.g. $Si_3N_4$ or $SiO_xN_y$). These layers are formed by any of the standard oxidation or deposition techniques known to one with ordinary skill in the art. The wafer has also been masked with a photoresist (104).

Figure 2:
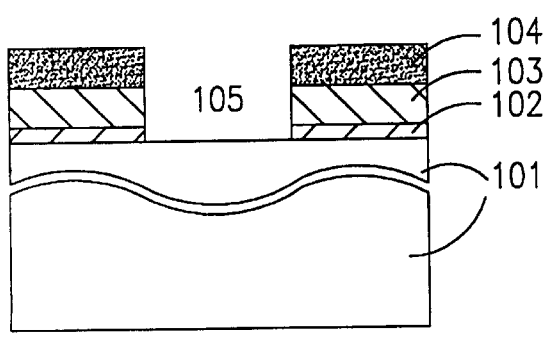
FIG. 2 shows the same surface as in FIG. 1 after etching.

In FIG. 2, the nitride (103) and oxide (102) layers are removed by existing etch techniques known to practitioners with ordinary skill in the art. What remains is a trench region (105) which has been etched down to the silicon crystal layer (101). The photoresist (104) is then removed. (The invention will function if the photoresist remains and is removed later in the process.) What remains are nitride (103), oxide (102) layers and an etched region (105) that penetrates to the silicon crystal substrate surface.

Figure 3:
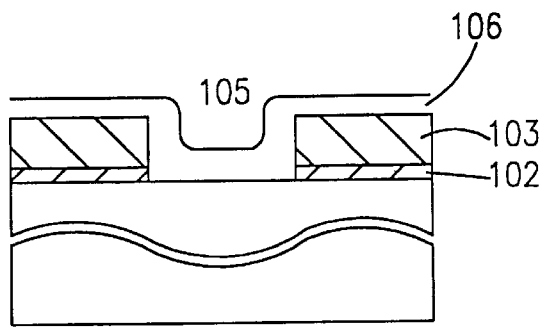
FIG. 3 shows the surface of FIG. 2 after mask removal and deposition of a polysilicon layer.

FIG. 3 depicts the deposition of a polysilicon (106) layer. The polysilicon is deposited by any of the standard methods in the art (e.g. chemical vapor deposition ("CVD")), coating the trench region (105) and the rest of the wafer surface. Although preferred, the polysilicon layer is not necessary to practice the invention. The ion implanter can be used to directly implant (damage) the wafer surface without the need for a polysilicon layer (106).

Figure 4:
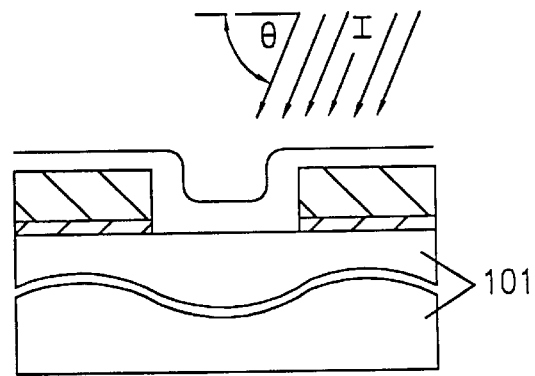
FIG. 4 shows the use of an ion implantation beam on the surface depicted in FIG. 3.

FIG. 4 depicts the use of the ion implanter to damage the silicon crystal substrate (101). The ion implantation beam (I) is projected downward. By varying the angle of implantation (θ) the area of damage can be shaped to specific needs.

Figure 5:
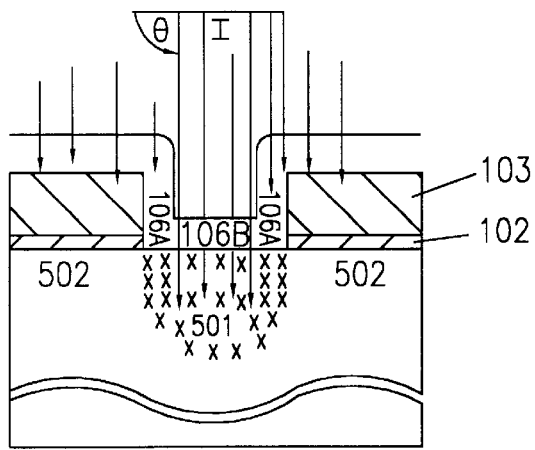
FIG. 5 shows the selective effect of the ion's implantation beam on the crystalline silicon surface and illustrates the damage differential in the silicon surface.

By implanting perpendicular to the surface (θ=90°) as shown in FIG. 5, damage is created in area (501). The nitride (103) and oxide (102) layers, as well as the photoresist (if still in place), serve as a mask, protecting the underlying silicon substrate (502). Due to the nature of the polysilicon coating process, the vertical depth of polysilicon is thicker in the wall regions (106A) than it is in the trench floor (106B). The net effect is that the ion bombardment penetrates deeper into the silicon substrate beneath area 106B and not as deeply in the areas under 106A. The nitride layer (103), and the oxide layer (102) serve as ion implantation barriers which prevent the penetration of ions into the underlying silicon substrate (502). This causes selective destruction of the surface in area (501). It is the damage differential between areas 501 and 502 that create the invention. Additionally, damage to area (501) can be shaped by varying the ion implantation angle θ from 90°. The damaged area (501) may also be shaped by variance of any of the other ion implantation parameters (e.g. wafer rotation, implantation current, temperature dosage or exposure time) which may be programmed into the ion implanter by computer. This allows the damaged area (501) to be shaped in any number of specific conformations. Particularly, the trench edges and corners may be rounded, to increase circuit reliability, and the trench walls may be sloped to any necessary angle.

Figure 6:
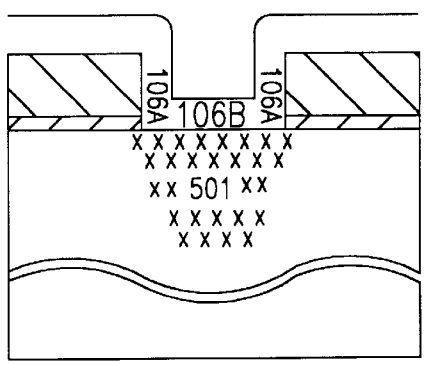
FIG. 6 shows a typical damage differential profile in the silicon surface after treatment by an ion implanter.

FIG. 6 depicts the after effects of ion implantation with high ion dose or with heavy ions. Area (501) shows the damaged silicon crystal structure. It should be noted that the damage penetrates deeper in the area under (106B) than the areas under (106A).

Figure 7:
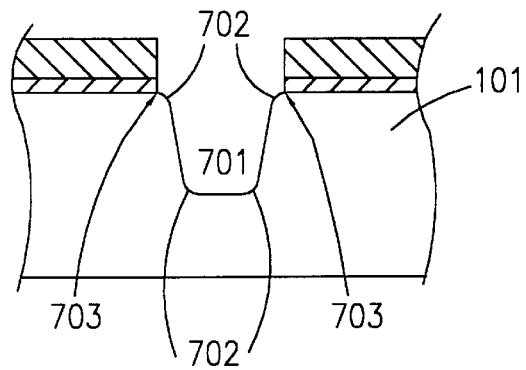
FIG. 7 shows the profile of FIG. 6 after a second etch removes the polysilicon layer and the damaged silicon substrate.

After the ion implantation has been used to selectively damage the substrate, an etching process is performed. The polysilicon layer and damaged silicon are etched out in one step, utilizing any of the standard techniques known by one with ordinary skill in the art (e.g. wet etching, plasma etching, reactive ion etching, etc.). FIG. 7 shows the remaining isolation trench (701) in the silicon substrate (101) after etching. A pronounced effect of ion implantation is that subsequent etching proceeds at a faster rate in the damaged silicon substrate surface than in an undamaged silicon crystal. The etchants preferentially remove the damaged substrate in a very short period of time. Due to the precise damage caused by the ion implanter, the area removed by the etchants is very well defined. FIG. 7 shows the rounded trench edges (702) caused by precise use of the ion implanter. This reduces circuit failure due to edge effects. It is an important feature of the invention that the corners can be rounded off or otherwise shaped. Furthermore, due to the short etching time now made possible by the damage differential, the oxide/silicon interface (703) is not significantly damaged by the etching process which also reduces the possibility of circuit failure.

Figure 8:
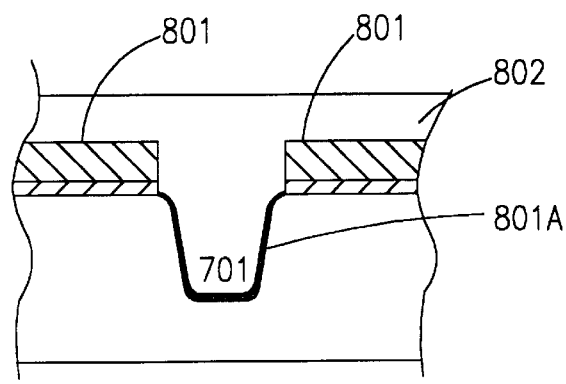
FIG. 8 shows the surface of FIG. 7 after an optional thermal oxidation of the trench region followed by deposition of a layer of electrically isolating material.

FIG. 8 shows the isolation process. The trench (701) and the surface (801) are covered with an electrically isolating material (802), typically an oxide, which will serve as the isolation insulator. Commonly, the walls of the trench (701) will be thermally oxidized to form a thin oxide layer (801A), just prior to coverage with the isolation layer (802). This step is not necessary to practice the invention, but may be incorporated into all isolation trenches. The electrically isolating material layer (802) should be thick enough so that no dipping occurs in the region above the trench (701).

Figure 9:
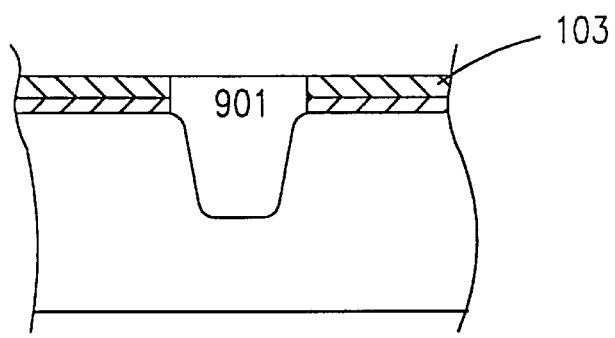
FIG. 9 shows the surface of FIG. 8 after chemical mechanical polishing is used to planarize the surface into the nitride layer.

FIG. 9 depicts the same isolation site after it has been ground down by chemical mechanical polish ("CMP") processes which are known in the art. The CMP grinds the surface into the nitride layer (103), leaving an oxide filled isolation trench (901).

Figure 10:
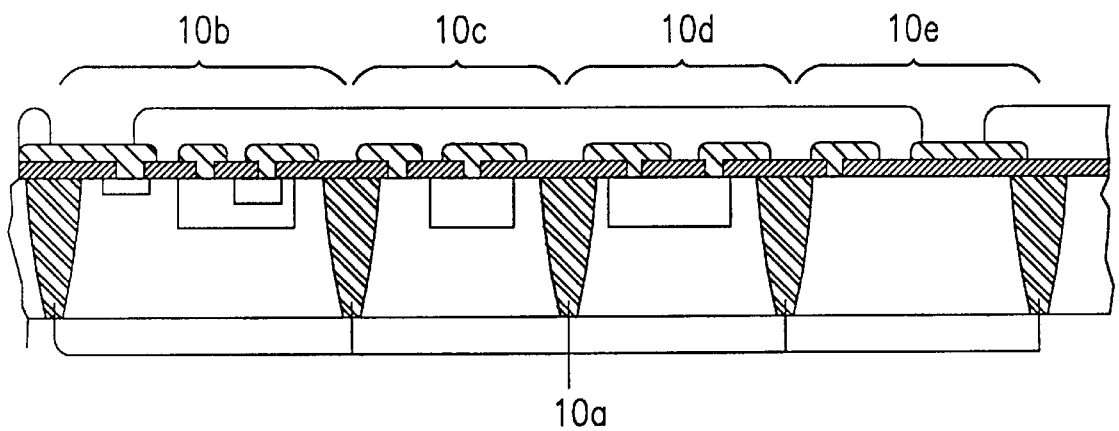
FIG. 10 shows an exemplar of the uses of isolation trenches created by the invention.

Such isolation trenches can be used to isolate specific circuit elements as shown in FIG. 10. For example, the isolation trenches (10a) can be used to isolate a variety of circuits such as transistors (10b), diodes (10c), resistors (10d), capacitors (10e), or may be used simply as an insulated and isolated site on which to build other circuit elements.

An alternate method, and probably the best mode of practicing the invention, is embodied in FIGS. 11 through 17.

Figure 11:
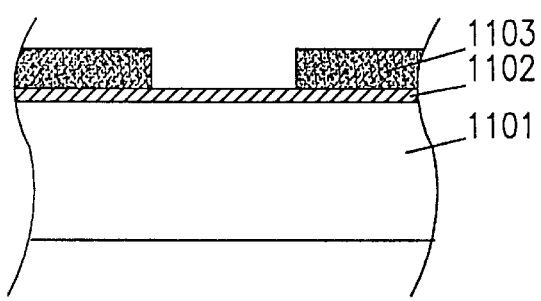
FIG. 11 shows a semiconductor substrate of the present invention with an oxide layer and a photoresist mask in place.

FIG. 11 shows a wafer of the instant invention prior to practicing the present invention. FIG. 11 shows a semiconductor substrate (1101) (typically a doped or undoped, crystalline silicon or gallium arsenide substrate) with an oxide layer (1102) (typically, silicon dioxide) and a photoresist mask layer (1103). No nitride layer is present. This simplifies manufacturing by removing one material altogether from the process.

Figure 12:
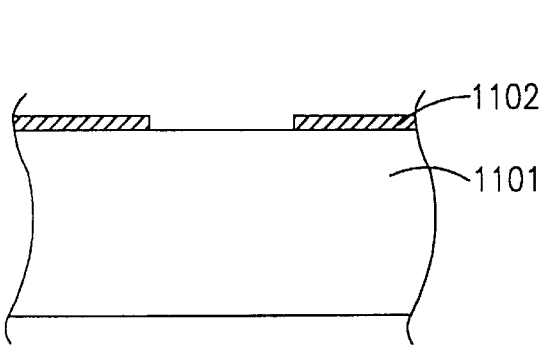
FIG. 12 depicts the substrate of FIG. 11 after etching and photoresist removal.

FIG. 12 depicts FIG. 11 after etching away the unmasked portion of the oxide layer down to the semiconductor substrate (1101) surface. As stated above, this etching can be accomplished by any wet or dry etch methods known to one skilled in the art. The photoresist is then stripped off. However, it should be noted that the photoresist removal step is not necessary to practice the invention.

Figure 13:
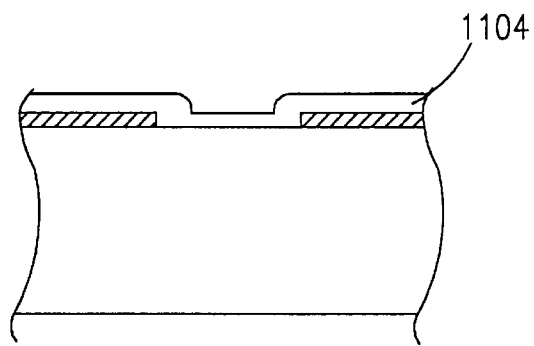
FIG. 13 depicts the surface of FIG. 12 after a conformal layer of polysilicon is added.
Figure 13A:
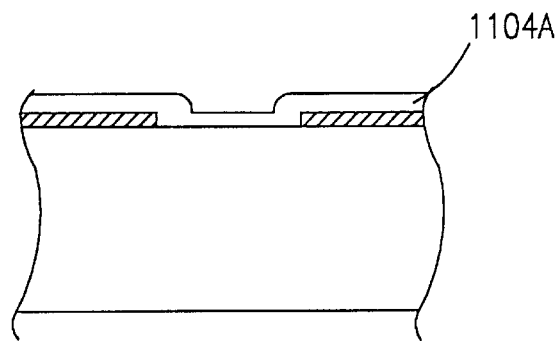
FIG. 13A depicts the surface of FIG. 12 after addition of a conformal layer of silicon dioxide.

A conformal layer of polysilicon is deposited (1104) over the substrate as shown in FIG. 13. This polysilicon layer may be deposited by any of the standard methods known in the art (e.g. CVD). Importantly, the conformal polysilicon layer may be replaced by a conformal layer of silicon dioxide (1104A) as shown in FIG. 13A. This oxide layer may be placed by deposition (e.g. CVD, etc.) or oxidation (e.g. thermal oxidation, etc.) techniques as are known by persons of ordinary skill in the art.

FIG. 14 depicts the use of an ion implanter (I) to selectively damage the semiconductor substrate (1101) of FIG. 13 through the conformal polysilicon layer (1104). The ion implanter creates the profile of the final isolation trench (1401). Once again the oxide layer (1102) and the polysilicon layer (1104) serve as barriers to the ion implanter, aiding in the shaping of the final trench profile (1401).

FIG. 15 depicts the substrate of FIG. 14 after etching removes the polysilicon layer (1104) and the damaged silicon material (1401) from the silicon substrate (1101). The etch is accomplished by any of the standard etch techniques known in the art. This etch leaves an isolation trench (1501) with rounded edges (1501A) and shaped trench profile.

FIG. 16 shows the isolation process. The trench (1501) and the oxide layer (1102) are covered with an electrically isolating material (1105), typically an oxide, which will serve as the isolation insulator. The electrically isolating material layer (1105) should be thick enough to prevent any dipping from occurring in the region above the trench (1501). CMP is then used to grind away the electrically isolating oxide layer (1105). CMP grinds the surface down into either the silicon dioxide layer (1102) or the silicon semiconductor substrate itself (1101). FIG. 17 depicts the surface of FIG. 16 planarized into the silicon dioxide layer (1102).

A similar process for creating isolation trenches involves similar procedures but alters the materials. A surface fabricated as in FIGS. 11 and 12, featuring an etched oxide layer (1102) over an underlying silicon substrate surface (1101) after removal of the photoresist. A silicon nitride layer is optional, but not necessary to practice the invention. FIG. 18 shows the surface of FIG. 12 after a second silicon dioxide layer (1801) has been put in place, either by deposition or oxidation, most commonly by CVD using tetraethyl orthosilicate (TEOS). This layer is then etched. Any directional etch technique may be used, but reactive ion etching ("RIE") at θ=90° is preferred. The reactive ion etching step, shown in FIG. 19 (depicted by R at angle θ), erodes the thinnest regions of the silicon dioxide layer (19a, 19b and 19c) while only partly eroding the silicon dioxide layer in the thicker regions (x and y).

This leaves the spacers (x and y) shown in FIG. 20. The spacers help shape the trench etch profile by blocking the ion implantation beam and protect the silicon dioxide/silicon interface (20a) from etch effects and encroachment. Note that the use of RIE is an optional step. The fabrication can be accomplished by leaving the oxide layer (1801 of FIG. 18) in place and ion implanting directly through the oxide layer without the RIE step.

FIG. 21 depicts use of the ion implanter to bombard the wafer surface (1101) with heavier ions or heavy doses of ions to damage the surface selectively. The second silicon dioxide layer (1102) and the spacers (x and y) serve to mask areas (1101a) and (1101b) from the ion implantation beam, while the ion implanter selectively damages area (1101c).

Figure 22:
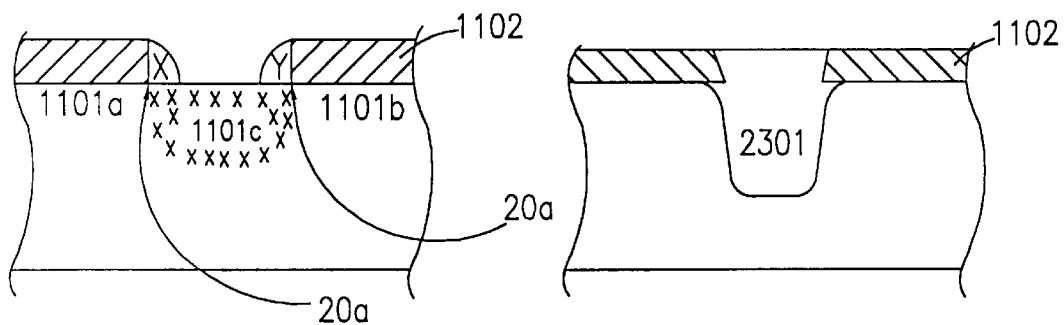
FIG. 22 shows the after effects of ion implantation, including the spacers protecting the oxide/silicon interface and the shaped damage differential of the crystalline silicon surface.

FIG. 22 depicts the selectively damaged silicon surface (1101c), and the adjacent undamaged silicon crystal areas (1101a, 1101b). In the following etching process the damaged silicon surface (1101c) is etched away while the undamaged area (1101a, 1101b) remains. The second silicon dioxide layer or the spacers prevent the etchants from damaging the Si/SiO$_2$ interface zones (20a). It should also be noted that the spacers (x and y) are made of SiO$_2$, the same as oxide layer (1102).

Figure 24:
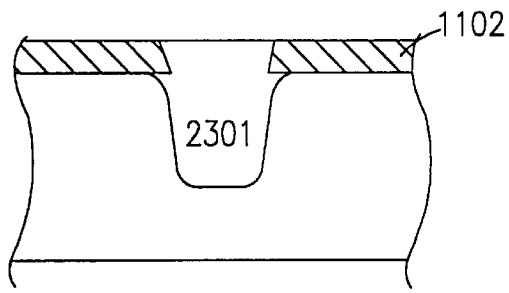
FIG. 24 shows the surface of FIG. 23 after chemical mechanical polishing of a surface which previously had been covered with a layer of electrically isolating material including coverage of the trench.
Figure 23:
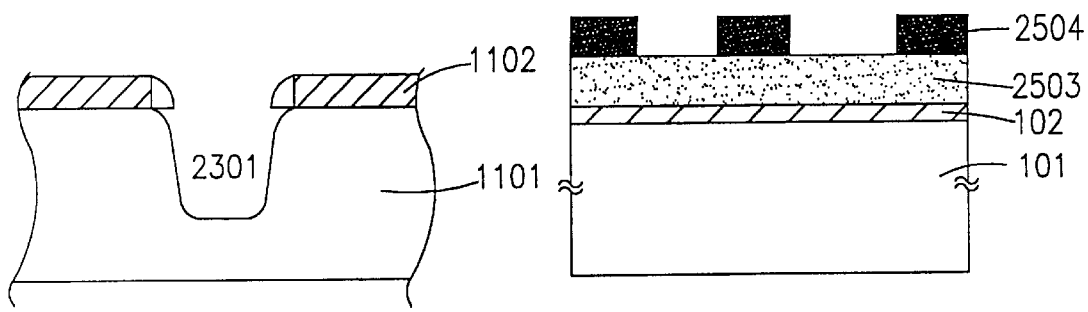
FIG. 23 is the surface depicted in FIG. 22 after etching the damaged silicon surface to leave a shaped trench profile.

After etching, the surface profile resembles that of FIG. 23. Subsequent to etching, the entire trench structure (2301) is filled and the surface is coated with silicon dioxide or any other electrically isolating material. The surface is then polished down to the silicon substrate (1101) or the silicon dioxide layer (1102) by CMP. The final profile of the isolation trench (2301) after CMP into silicon dioxide layer (1102 is depicted by FIG. 24. As shown in FIG. 10, the silicon dioxide isolation trenches can be used as an isolation between circuit elements, or as substrates on which to build an isolated circuits.

The method of the present invention is not confined to the etching of semiconductor materials. It may be used to shape etch profiles in conducting materials. Such a process is illustrated in FIGS. 25 through 27.

Figure 25:
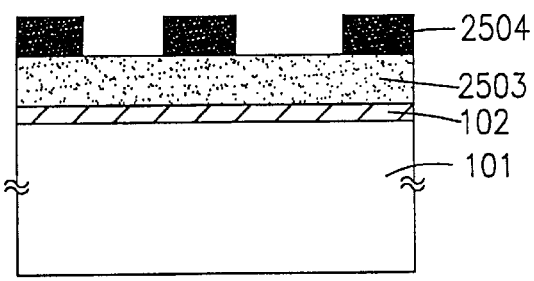
FIG. 25 depicts a semiconducting substrate, an oxide layer, and a layer of conducting material coated with a photoresist mask.

FIG. 25 shows a semiconductor substrate (101) (usually silicon or gallium arsenide) with an oxide layer (102). Over the oxide layer (102) is a conducting layer (2503). The conducting layer (2503) (typically polysilicon, doped polysilicon, or metal) has been pattern masked with photoresist (2504). The photoresist serves as a blocking layer for the following ion implantation step.

FIG. 26 depicts the structure after treatment with an ion implanter to selectively damage the exposed conductor areas (26A). The photoresist (2504) protects the underlying conductor areas (26B). The ion implantation parameters may be set such that the oxide layer (102) is not damaged.

The structure is then etched to remove the selectively damaged conductor (26A of FIG. 26), leaving non-conducting regions (27A) between the conducting regions (26B) over the oxide layer (102), as in FIG. 27. The photoresist mask is then removed, leaving the final profile as shown in FIG. 27.

Another embodiment of particular usefulness, uses the ion implanter to etch and dope simultaneously. This technique can be used in concert with any of the previously disclosed embodiments. By way of example, a structure as in FIG. 13 is created as shown in FIG. 28. This includes a doped semiconductor substrate (2801) with an etched oxide layer (2802) covered with a conformal polysilicon layer (2803). This structure is then bombarded by an ion implanter (I). The implantation ion species may be chosen from a number of candidates. For a P-wafer (2801), the implantation is conducted with P-ions (e.g. gallium), or with heavy P-ions (e.g. gallium) in conjunction with lighter P-ions (e.g. boron). Alternatively, if the semiconductor substrate (2801) is an N-type wafer, N-type ions are used (e.g. antimony, arsenic, phosphorus, etc.). This method is especially useful, because regardless of the ion species used to damage the substrate surface, other ion species may be added to effectively dope the implanted region. FIG. 28 also shows the effects of ion implantation selective damage (2801 A), which is shaped to accommodate the specific needs of the process engineer.

FIG. 29 shows the structure of FIG. 28 after etching of the selectively damaged area (2801A). Not all of the area treated by the ion implanter is removed. The unremoved area remains as a highly doped region (29A) which serves to enhance the isolation properties of the isolation trench (2801A). In a P-wafer, the highly doped region (29a) will be highly doped with P-ions.

Figure 30:
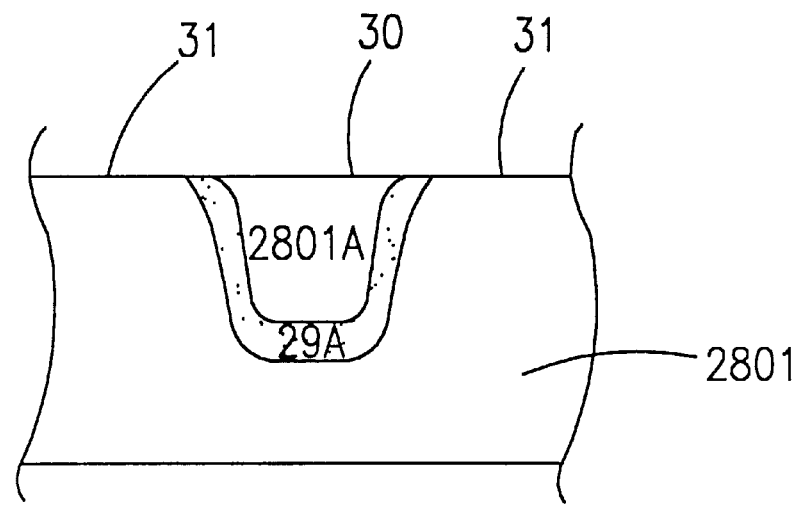
FIG. 30 depicts the surface of FIG. 29 after deposition of an electrically isolating material and chemical mechanical polishing to planarize the surface.

The subsequent process steps follow the same format as disclosed above (i.e. coating with electrically isolating material and CMP). The final structure, featuring an isolation trench (2801A), a highly doped region (29A), a lightly doped wafer (2801), and a planarized surface with isolation regions (30) and active regions (31) is shown in FIG. 30. These structures are typically used in complementary metal oxide semiconductor ("CMOS") devices.

Figure 31:
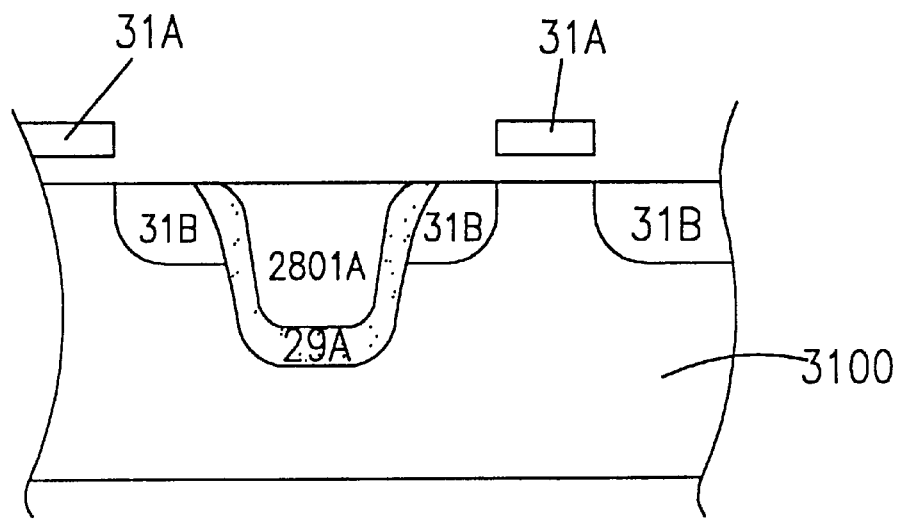
FIG. 31 depicts a typical circuit structure fabricated using the present invention.

FIG. 31 is a typical example of such a structure in an N-doped wafer (3100), featuring gates (31A), P-doped drains and sources (31B), an isolation trench (2801A) with a highly P-doped region (29A).

The present invention has been particularly shown and described with respect to a certain preferred embodiments and the features thereof. However, it should be readily apparent to those of ordinary skill in the art that various changes and modifications in form, semiconductor material, material conductivity type (i.e. N-type or P-typed), and detail may be made without departing from the spirit and scope of the invention set forth in the appended claims. The advanced method for etching is widely applicable to numerous semiconductor structures. The inventions illustratively disclosed herein may be practiced without any element which is not specifically disclosed herein.

What is claimed is:

1. A method for fabricating trenches in semiconductor substrates comprising the following steps:
   a) providing a semiconductor substrate, said substrate having a surface;
   b) forming a plurality of masking or protective layers on said surface to define a trench region;
   c) forming a conformal layer over said plurality of masking or protective layers and said semiconductor substrate in said trench region;
   d) bombarding said semiconductor substrate through said conformal layer with an ion implantation device to create specifically shaped selectively damaged areas in said semiconductor substrate; and
   e) etching away said selectively damaged areas of said semiconductor substrate to form trenches having a final profile determined by said specifically shaped selectively damaged areas.

2. A method for etching microelectronic integrated circuit structures comprising the following steps:
   a) providing a semiconductor substrate which may be doped or undoped;
   b) fabricating at least one of masking or protective layers on said semiconductor substrate according to a set pattern;
   c) a first etching to remove selected portions of said at least one of masking or protective layers exposing a portion of said semiconductor substrate creating a trench region;
   d) fabricating a conformal layer on said at least one of masking or protective layers including said exposed portion of said semiconductor substrate in said trench region;
   e) bombarding said semiconductor substrate through said conformal layer with an ion implantation device to create selectively damaged areas in said trench region of said semiconductor substrate, the selectively damaged areas having a shape being determined by the presence of said conformal layer;
   f) performing a second etching to remove said selectively damaged areas in said trench region of said semiconductor substrate to form an isolation trench;
   g) filling said isolation trench with electrically isolating material; and
   h) planarizing said electrically isolating material and said isolation trench using chemical mechanical polishing.

3. A process as in claim 2 wherein said at least one of masking or protective layers comprises a first layer of silicon dioxide and a second layer of silicon nitride.

4. A process as in claim 2 wherein said at least one of masking or protective layers comprises a first layer of silicon dioxide and a second layer of silicon oxynitride.

5. A process as in claim 2 wherein said at least one of masking or protective layers comprise a single layer of silicon dioxide.

6. A process as in claim 2 wherein said conformal layer is comprised of polysilicon.

7. A process as in claim 2, wherein said step, e), of bombarding said semiconductor substrate through said conformal layer with an ion implantation device to selectively damage said trench region further includes shaping said selectively damaged areas by controlling ion implantation parameters.

8. A method for etching microelectronic integrated circuit structures comprising the following steps:
   a) providing a semiconductor substrate which may be doped or undoped;
   b) fabricating at least one of masking or protective layers over said semiconductor substrate according to a set pattern;
   c) etching away portions of said at least one of masking or protective layers in a first etch step, exposing a portion of said semiconductor substrate creating a trench region;
   d) fabricating a silicon dioxide conformal layer on said at least one of masking or protective layers and on said exposed portions of semiconductor substrate including said trench region;
   e) etching away portions of silicon dioxide conformal layer in a second etch step, forming spacers which cover portions of said trench region;
   f) after steps d) and e), bombarding said semiconductor substrate and said spacers with an ion implantation device to selectively damage portions of said trench region;
   g) removing said selectively damaged portions of semiconductor substrate and said spacers creating an isolation trench region;
   h) filling said isolation trench region with electrically isolating material to create isolation trenches; and
   i) planarizing said isolation trenches with chemical mechanical polishing.

9. A process as in claim 8 wherein said at least one of masking or protective layers comprise a first layer of silicon dioxide and a second layer of silicon nitride.

10. A process as in claim 8 wherein said at least one of masking or protective layers comprise a first layer of silicon dioxide and a second layer of oxynitride.

11. A process as in claim 8 wherein said at least one of masking or protective layers comprise a single layer of silicon dioxide.

12. A process as in claim 8 wherein said second etch step is performed using a technique selected from the group consisting of reactive ion etching and plasma etching.

13. A process for fabricating isolation trenches with doped walls comprising the following steps:
   a) providing an N- or P-doped semiconductor substrate;

b) fabricating a plurality of masking or protective layers over said semiconductor substrate according to a set pattern;

c) a first etching to remove selected portions of said plurality of masking or protective layers to expose portions of said semiconductor substrate defining a trench region;

d) fabricating a conformal layer on said plurality of masking or protective layers including said exposed portions of said semiconductor substrate in said trench region;

e) bombarding said semiconductor substrate through said conformal layer with ions having a same charge as said semiconductor substrate to simultaneously create a doped region in said semiconductor substrate and selectively damage portions of said semiconductor substrate in said trench region;

f) performing a second etch to remove portions of said selectively damaged semiconductor substrate while leaving said doped region in place forming an isolation trench;

g) filling said isolation trench with electrically isolating material; and h) planarizing said electrically isolating material, including said isolation trench, using chemical mechanical polishing.

14. A process for fabricating isolation trenches with doped walls comprising the following steps:

a) providing an N- or P-doped semiconductor substrate;

b) fabricating a plurality of masking or protective layers over said semiconductor substrate according to a set pattern;

c) etching away portions of said plurality of masking or protective layers in a first etch step, exposing portions of said semiconductor substrate creating a trench region;

d) fabricating a silicon dioxide conformal layer on said plurality of masking or protective layers and said exposed portions of said semiconductor substrate in said trench region;

e) etching away portions of said silicon dioxide conformal layer in a second etch step, leaving spacers;

f) after steps d) and e), bombarding said semiconductor substrate with ions having a same charge as said semiconductor substrate to simultaneously create a doped region in said semiconductor substrate and to selectively damage portions of said semiconductor substrate in said trench region;

g) performing a second etch to remove portions of said selectively damaged semiconductor substrate while leaving said doped region in place forming an isolation trench;

h) filling said isolation trench region with electrically isolating material to create isolation trenches; and i) planarizing said electrically isolating material and said isolation trenches with chemical mechanical polishing.

15. A method for etching microelectronic integrated circuit structures comprising the following steps:

a) providing a semiconductor substrate;

b) fabricating a plurality of masking or protective layers over said semiconductor substrate according to a set pattern;

c) removing portions of said plurality of masking or protective layers in a first removing step, revealing a surface of said semiconductor substrate creating a trench region;

d) fabricating a polysilicon conformal layer on said plurality of masking or protective layers and on said exposed portions of semiconductor substrate including said trench region;

e) bombarding said semiconductor substrate through said polysilicon conformal layer with an ion implantation device to selectively damage said trench region, said selective damage having a shape being determined by said polysilicon conformal layer; and f) performing a single etch to remove both said selectively damaged trench region and said polysilicon conformal layer to create a shaped trench region.

16. A method as in claim 15, wherein an isolation trench may be formed by including the further steps of:

g) filling said shaped trench region with electrically isolating material; and h) planarizing said electrically isolating material in said trench region with chemical mechanical polishing.

17. A process as in claim 15 wherein said plurality of masking or protective layers comprise a first layer of silicon dioxide and a second layer of silicon nitride.

18. A process as in claim 15 wherein said step, e), of bombarding said semiconductor substrate through said conformal layer with an ion implantation device to create said selectively damaged areas in said trench region further includes determining the shape of said selectively damaged areas by controlling ion implantation parameters.

* * * * *